(12) United States Patent
Taussig

(10) Patent No.: US 6,478,231 B1
(45) Date of Patent: Nov. 12, 2002

(54) METHODS FOR REDUCING THE NUMBER OF INTERCONNECTS TO THE PIRM MEMORY MODULE

(75) Inventor: Carl Taussig, Woodside, CA (US)

(73) Assignee: Hewlett Packard Company, Palo Alto, CA (US)

(*) Notice: Subject to any disclaimer, the term of this patent is extended or adjusted under 35 U.S.C. 154(b) by 0 days.

(21) Appl. No.: 09/894,143

(22) Filed: Jun. 29, 2001

(51) Int. Cl.[7] .............................................. G06K 19/06
(52) U.S. Cl. ........................ 235/492; 235/441; 365/105
(58) Field of Search ................................. 235/492, 441, 235/449, 493, 475, 486, 375; 365/105, 175, 243, 185.11, 185.12, 185.26, 185.33, 185.05

(56) References Cited

U.S. PATENT DOCUMENTS

| 4,954,989 A | * | 9/1990 | Auberton-Herve et al. | . 365/177 |
| 5,905,670 A | * | 5/1999 | Babson et al. | ............. 365/105 |
| 5,909,617 A | * | 6/1999 | Manning et al. | ............ 438/238 |
| 5,952,691 A | * | 9/1999 | Yamaguchi | ................. 257/315 |
| 6,141,250 A | * | 10/2000 | Kashimura | ............ 365/185.11 |
| 6,256,767 B1 | * | 7/2001 | Kuekes et al. | ................. 257/23 |
| 6,346,733 B1 | * | 2/2002 | Lee et al. | .................... 257/390 |
| 6,362,039 B1 | * | 3/2002 | Manning et al. | ............ 257/198 |
| 6,385,075 B1 | * | 5/2002 | Taussig et al. | .............. 365/105 |

* cited by examiner

Primary Examiner—Thien M. Le

(57) ABSTRACT

A method and device for reducing the number of interconnections between a memory module and interface circuit comprises a memory module having a plurality of memory layers and an addressing circuitry, wherein the memory layer is formed as layers of arrays of memory elements. Furthermore, each of the plurality of memory layers includes memory array circuits and modulation circuits. The memory array circuits are cross-point memory array circuits. The modulation circuits receive signals transmitted from the array and spread the signals across a frequency spectrum. The modulation circuit is a band-pass filter coupled to a rectifier circuit. Each of the plurality of memory layers is coupled to a multiplexing/demultiplexing circuit, which further reduces the number of, required connections between the memory module and an interface and control circuit.

17 Claims, 5 Drawing Sheets

METHODS FOR REDUCING THE NUMBER OF INTERCONNECTS TO THE PIRM MEMORY MODULE

FIELD OF INVENTION

The invention relates to the field of digital memory circuits, and in particular to using multiplexing and modulating techniques in order to reduce the number of interconnections required between a memory array and an interface circuit.

BACKGROUND OF THE INVENTION

Many consumer devices are now constructed to generate and/or utilize digital data in increasingly large quantities. Portable digital cameras for still and/or moving pictures, for example, generate large amounts of digital data representing images. Each digital image may require up to several megabytes (MB) of data storage, and such storage must be available in the camera. To provide for this amount of data storage application, the storage memory should be relatively low in cost for sufficient capacities of around 10 MB to 1 gigabyte (GB). The storage memory should also be low in power consumption (e.g. <<1 Watt) and have relatively rugged physical characteristics to cope with the portable battery powered operating environment. For archival storage, data need only be written to the memory once. Preferably the memory should have a short access time (in the order of milliseconds) and moderate transfer rate (e.g. 20 Mb/s). Preferably, also, the storage memory should be able to be packaged in an industry standard interface module, such as a Memory Stick or Compact Flash Card.

One form of storage currently used in portable devices such as digital cameras is flash memory. This meets the desired mechanical robustness, power consumption, transfer, and access rate characteristics mentioned above. However, a major disadvantage is that Flash memory remains relatively expensive ($1.50–$2 per MB). Because of the price it is generally unreasonable to use Flash memory storage as an archive device, thus requiring data to be transferred from it to a secondary archival storage.

Magnetic "hard disk" storage can be used for archival storage, even in portable devices. Miniature hard disk drives are available for the PCMCIA type III form factor such as IBM's Microdrive, offering capacities of up to 1 GB. However, such disk drives are still relatively expensive ($0.5 per MB), at least partially because of the relatively high fixed cost of the disk controller electronics. Miniature hard drives have other disadvantages when compared to Flash memory, such as lower mechanical robustness, higher power consumption (~2 to 4 Watt), and relatively long access times (~10 ms).

Recordable optical storage discs can similarly be used, and removable optical discs offer one large advantage compared to the hard disk. The removable optical media is very inexpensive, for example of the order of $0.03 per MB for Minidisc media. However, in most other respects optical discs storage compares poorly with magnetic hard disks including relatively poor power consumption, mechanical robustness, bulk and access performance.

Another form of archival storage is described in co-pending U.S. Patent application Ser. No. 09/875,356 entitled "Write-Once Memory", filed Jun. 5, 2001 the disclosure of which is hereby incorporated herein by reference. The memory system disclosed therein aims to provide high capacity write-once memory at low cost for archival storage. This is realized in part by providing a portable, inexpensive, rugged memory system (PIRM) that avoids silicon substrates and minimizes process complexity. The PIRM memory system includes a memory module formed of a laminated stack of integrated circuit layers constructed on plastic substrates. Each layer contains a cross-point diode memory array, and sensing of the data stored in the array is carried out from a separate integrated circuit remotely from the memory module. The probable lowest cost implementation of the PIRM memory system is one in which the controller and other reusable electronics are either embedded in the appliance or reside in an adapter that inserts into a memory card slot. The PIRM memory module would connect via a proprietary interface to the controller. A difficultly with this approach is that making the connection between the controller and the memory module may involve a large number of connections, on the order of 120 or more. Making a low cost, compact, reliable controller to accommodate that many connectors is challenging.

Those skilled in the art will appreciate these and other advantages and benefits of various embodiments of the invention upon reading the following detailed description of a preferred embodiment with reference to the below-listed drawings.

SUMMARY OF THE INVENTION

In one aspect, the invention is a memory device. The memory device comprises a plurality of memory layers, wherein each of the plurality of layers includes a memory array; a plurality of signal modulating circuits coupled to each of the memory arrays; and a line reduction circuit coupled to the each of the plurality of memory layers. Furthermore, each of the plurality of signal modulating circuits comprises a band-pass filter circuit coupled to a rectifier circuit in series. The memory device further comprises an interface and control circuit coupled to the line reduction circuit via an interface connection. Also, the memory array is a cross-point memory array. And the line reduction circuit is a multiplexing/demultiplexing circuit. Also, the line reduction circuit is implemented on a thin non-semiconductor substrate.

In a second aspect, the invention is a memory device comprising a cross-point memory array having first and second sets of transverse electrodes and an addressing circuit; a filter and rectifier circuit connected in series; and a line reduction circuit; wherein the filter and rectifier circuit spreads predetermined signals across a frequency spectrum. Furthermore, the line reduction circuit comprises multiplexer and demultiplexer circuits. The memory device includes at least one of filters and the rectifier circuits are coupled to a power supply. And filter is a band-pass filters and the rectifier circuit includes a diode. The memory device includes the first and second sets of transverse electrodes are formed with respective memory elements formed at the crossing points of the first and second set of electrodes. Also, the memory has the first connections couple each memory array electrode in the first set to a respective unique subset of the first set of address lines and the second connections couple each memory array electrode in the second set to a respective unique subset of the second set of memory array electrodes. The memory device further comprises an interface circuit which is coupled to each of the plurality of memory layer circuits.

In a third aspect, the invention is a method for reducing the number of interconnections between a memory module and a memory controller comprising the steps of: addressing a memory element in the memory array by applying a predetermined electrical signal to the first and second set of predetermined lines to enable the state of the memory element; and transmitting the addresses from the memory array to an interface and control circuit by spreading multiple memory element addresses over a predetermined frequency spectrum. The method includes the steps of spreading multiple memory element addresses is carried out using a filter and rectifier circuit connected in series and multiplexing the spread addresses and transmitting the address to said interface and control circuit via an interface.

Those skilled in the art will appreciate these and other advantages and benefits of various embodiments of the invention upon reading the following detailed description of a preferred embodiment with reference to the below-listed drawings.

BRIEF DESCRIPTION OF THE DRAWINGS

The invention is described in greater detail hereinafter, by way of example only, through description of a preferred embodiment thereof and with reference to the accompanying drawings in which.

DETAILED DESCRIPTION OF THE PREFERRED EMBODIMENT

In the following description, where "data" is referred to, it will be appreciated that such "data" may be represented in different ways depending upon the context. As an example, a voltage level, a magnetic state, or a physical characteristic such as electrical resistance that presents a measurable effect such as voltage or current level or change to a sensing circuit, for instance, might represent "data" in a memory cell. On the other hand, on a bus or during transmission such "data" might be in the form of an electrical circuit or voltage signal. Furthermore, herein "data" in most circumstances is primarily binary in nature which may be for convenience be referred to as represented by states of "0" and "1", but it will be appreciated that the binary states in practice might be represented by relatively different voltages, currents, resistances or the like and it is generally immaterial whether a particular practical manifestation represents a "0" or a "1".

An embodiment of the invention as described in detail hereinafter provides a portable, inexpensive, rugged memory (PIRM) system that is particularly useful for data storage in appliances such as digital cameras and portable digital audio devices, among other things, although those skilled in the art will appreciate that the memory system and its various components and aspects can also be used in many other applications. In the described embodiment, the memory system is incorporated into an industry standard compact flash memory.

Figure 1:
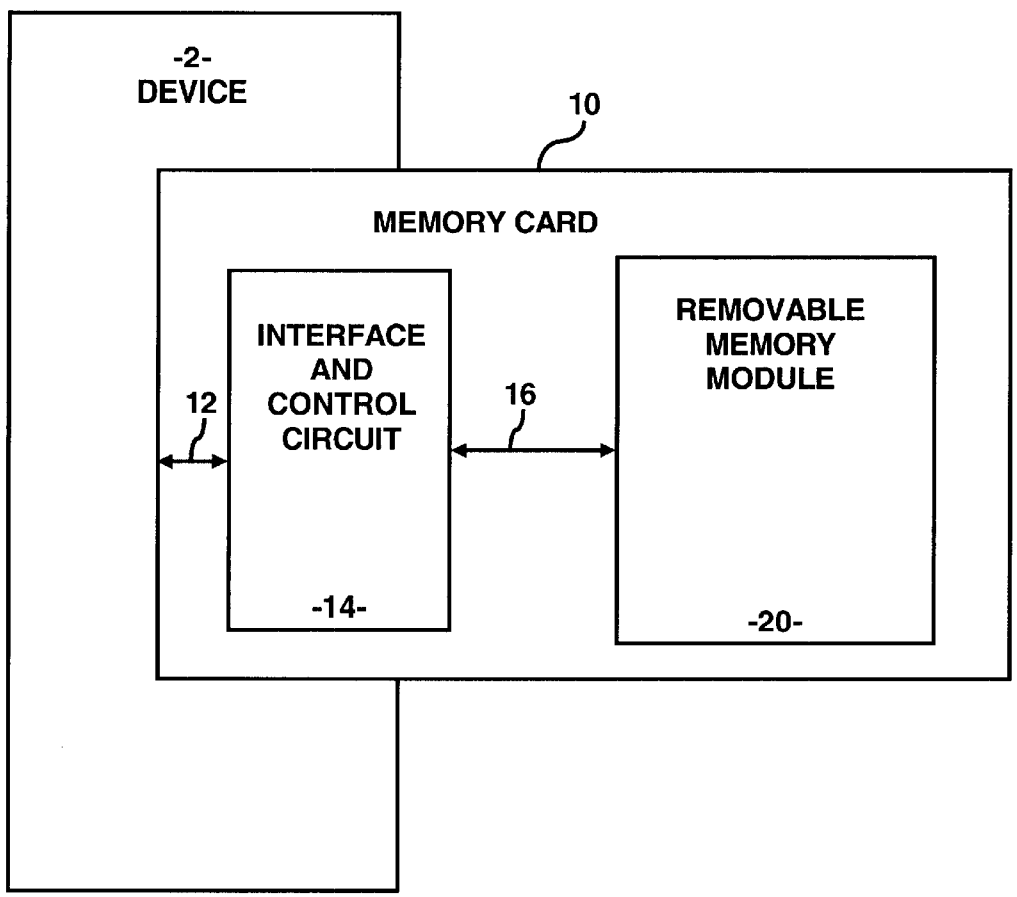
FIG. 1 is a block diagram of a write-once memory system according to an embodiment of the invention.

A memory card 10 is illustrated in block diagram form in FIG. 1. The memory card 10 has an I/O interface connector 12 through which communication is carried out between the card 10 and a device 2 to which it is coupled. The interface connector 12 is coupled to an interface and control circuit 14 which is connected to a removable memory module 20. The memory module 20 provides circuitry for write-once data storage including write enabling, and addressing/sensing functions. The interface and control circuit 14 comprises circuitry for control, interface, detection, and error correction coding (ECC) for each removable memory module 20. The memory module 20 is received in a connector device in a memory card 10, so that it may be removed therefrom and replaced with another memory module 20. When received in the memory card, the memory module 20 is coupled to the interface and control circuit 14 through an internal interface 16.

Write-once data storage means that, effectively, data can only be written once to the memory and thereafter it remains unchangeable. In many forms of write-once memory it is not strictly true that the data stored therein cannot be changed at all after being initially written, however, in general it cannot be changed arbitrarily, as those skilled in the art will appreciate. For example, most write-once memories are fabricated with each memory cell in a first binary state (e.g. representing a binary "0"), and during a write procedure selected memory cells are changed into a second binary state (e.g. representing a binary "1"). Often the change in the memory cell from the first binary state to the second binary state is irreversible, such that once a data "1" is written it cannot be changed back to a data "0". This restricts the changes to the stored data that can be made after it has been written to the memory. Data can only be written once and thereafter a data "0", for example, can only be changed to a data "1" and, not the other way around.

Since the memory module 20 contains write-once memory, it is appropriate for archival data storage wherein the data, once stored, is preserved. This is somewhat like a photographic film, where pictures are stored thereon once, and the developed film is kept as a permanent record. Therefore, once the memory module 20 has been filled to capacity with data, another is required for further data storage. It would be possible to replace the entire memory card 10 in the device 2, however, that would mean the interface and control circuitry 14, as well as, the memory card structure is archived along with the memory module. In order to reduce the data storage costs, it is desirable that reusable and relatively expensive components of the memory system not be permanently coupled to the actual storage memory, and for that reason the memory module 20 is removable from the memory card 10 in a preferred embodiment. Therefore, the memory modules 20 for insertion therein are fabricated inexpensively as discussed further herein below.

The control/interface circuitry 14 may generally resemble an "AT" style disk controller circuit, further including ECC and defect management functions, as well as, functions required to operate the memory module 20. These functions include: writing to the memory module including setting write voltages, setting write enable lines and controlling power supply striping; addressing the memory by converting logical addresses to address line patterns required to access physical memory locations; and data read processing of sense line outputs.

The control/interface circuitry 14 may also provide functions to emulate certain features of rewritable memory cards, such as logical deletion of data files and the like. Such functions of the interface/control circuitry 14 can be implemented without difficulty in a custom integrated circuit, for example. The details of the required functions outlined above will become more fully understood from the following description of the structure and operation of the memory module 20.

The internal interface 16 is provided for coupling between the interface/control circuitry 14 and the memory module 20 in the memory card 10. The internal interface 16 receives the memory module and provides electrical connections between the interface and control circuitry 14 and memory module 20. A suitable form of plug and socket arrangement may be employed, although the most appropriate structure depends strongly upon the actual number of connections to be made. Connecting contacts on the memory module can be formed on the external surface thereof, for example, as described hereinafter, to enable edge connection schemes or land grid array (LGA) connections. Many kinds of connection schemes are possible, as will be recognized by those skilled in the art for implementation without undue difficultly.

Figure 2:
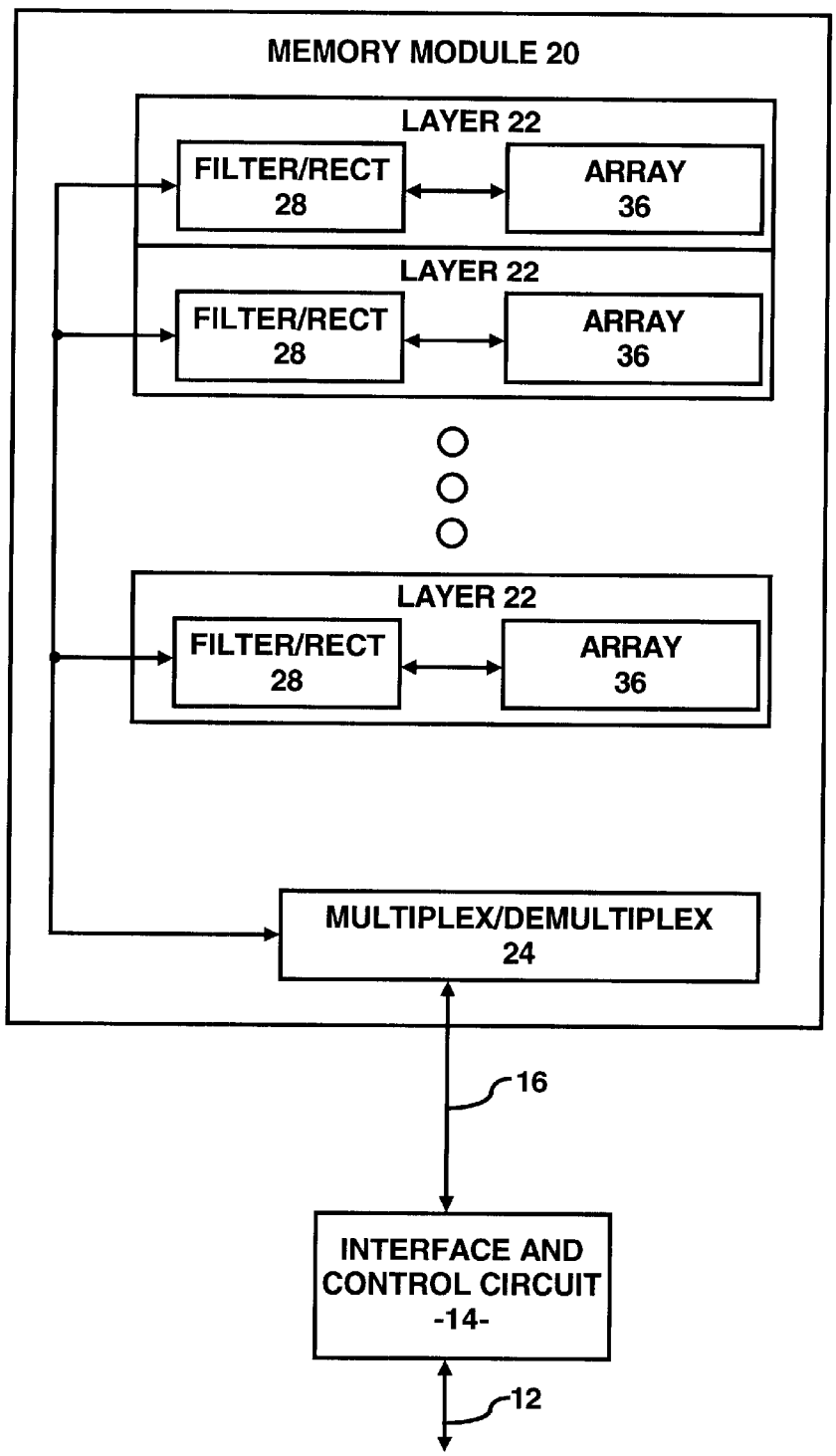
FIG. 2 is a block diagram of the write-once memory system illustrating the general structure of a memory module thereof.

A diagrammatic block representation of the memory module 20 is shown in FIG. 2, coupled to the interface and control circuit 14. In order to maximize the storage capacity of the memory module 20, the module 20 is constructed from a stack of laminated layers 22. Each layer 22 has an array 36 of memory elements that provide the data storage (as will be discussed in further detail with regard to FIG. 3). The layers 22 also include modulating circuitry 28 coupled to the respective memory layers 22 and to a multiplexing/demultiplexing circuitry 24. The modulating circuitry 28 reduces the number address and sense lines output from the layers 22 by a predetermined multiplicative factor. The modulating circuitry 24 spreads the address and sense lines, output from the array over a predetermined frequency spectrum. Accordingly, multiple signals can be transmitted over a single line. The multiplexing/demultiplexing circuitry 24 outputs the combined signals through the memory system interface 16 to the interface and control circuit 14. The modulating circuitry 28 on each layer 22 enables fewer interconnecting conductors between the layers of the memory module, which facilitates ease of fabrication and thus lowers costs. The multiplexing/demultiplexing circuit 24 reduces the number of interconnections between the memory module 20 and the controller 14 by multiplexing the number of signals carried on each line in a manner well known in the art.

The multiplexing/demultiplexing circuitry 24 is an additional layer of electronics that is capable of consolidating the address, sense, and power supply lines (not shown) generated by the memory modules of each layer 22, into a small number of lines. There are several possible technologies that might be suitable for performing line reduction. For example, Screen Print TFT(s) and Electrostatic relays could also be used to perform the conversion. These devices are discussed further in the above-mentioned co-pending application entitled, "Write-Once Memory." However, the preferred embodiment of the invention employs passive components such as resistors and capacitors. These components can be inexpensively fabricated on a flexible substrate.

The address lines control which element in the memory array 36 whose state is detected by the sense line or lines on that layer 22. To minimize the number of interconnections the address lines are connected in parallel across all the layers 22, however, each layer 22 must contain at least one sense line. There maybe more than one sense line in an array 36. There may also be multiple memory arrays 36 on each layer 22 each with common address lines and independent sense lines. During the write process the sense lines serve as write enable lines allowing independent data to be written on a series of bits addressed in common. The addressing and sensing scheme is described in co-pending U.S. patent application Ser. No. 09/875,496 entitled, "Addressing and Sensing a Cross-Point Diode Memory Array", the disclosure of which is incorporated by reference.

The interface and control circuit 14 is tab-bonded in a recess of a thin printed circuit board and attached to the memory module layers 22 and the line reduction circuit 24. The multiplexing/demultiplexing circuitry layer 24 is fabricated on a flexible substrate in order to reduce costs.

Figure 3:
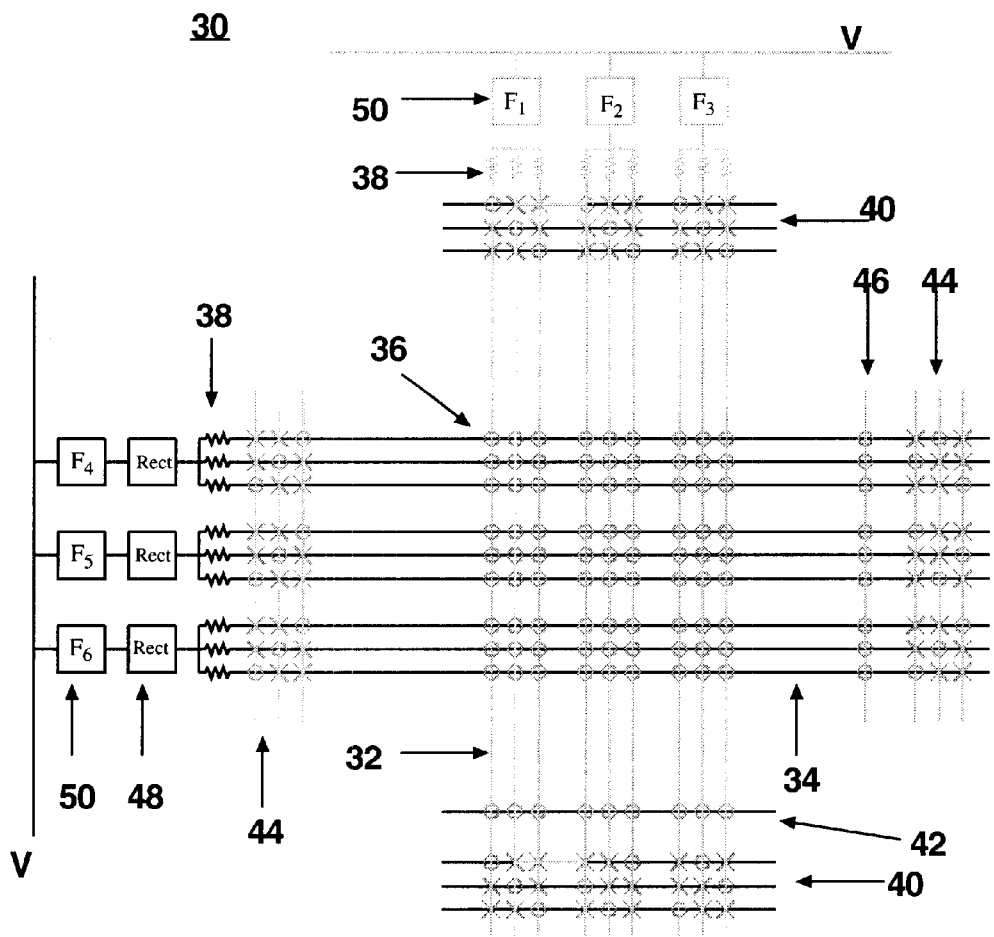
FIG. 3 is block diagram of the memory module as set forth in the preferred embodiment of the invention.

FIG. 3 illustrates the preferred embodiment of the memory module array 30. The array 30 of memory elements is formed on each of the layers 22 in the memory module 20. The memory module array 30 is a cross point diode array with addressing and sensing circuitry. As shown, the array 30 has column electrodes 32 and row electrodes 34 separated in groups of three. Boxes labeled (F1–F6) 50 and Rect. 48 illustrate the RC band-pass network and the rectifier circuit respectively. The RC band-pass network and the rectifier circuit are the modulation circuit 28.

Diodes are formed the intersections of the electrodes, creating the cross-point diode memory array 36. In the Figure diode elements that are intact are indicated by an "O" at the respective intersection, and diode elements that are blown are indicated by an "X". The cross-point memory array 36 shown bas no data stored in it and thus all of the diodes therein are intact. In the preferred embodiment of the invention, each memory element comprises a fuse element (not shown) coupled in series with a diode element (not shown). The fuse element provides the actual data storage effect of the memory element, whilst the diode facilitates isolation of the memory elements from one another in the cross-point memory array during the read and write processes. The fuse element may be realized as a separate element that will open a circuit when a critical current is passed through or it may be incorporated in the diode. One of ordinary skill can appreciate that a diode and anti-fuse in series may also be employed as a memory element.

The row and column electrodes (32, 34) extend out from the cross-point array 36 and are terminated by pull-up/pull-down resistors 38. Groups of the pull-up/pull-down resistors have their free ends connected in common. These groups are referred to as stripes. For example, each stripe on FIG. 3 contains 3 three rows or columns. The purpose of the stripes is to facilitate applying power to a sub-section of the array and thereby reduce the overall power consumption. On the row electrodes, the row stripes are coupled to corresponding rectifier circuits 48 that are in turn coupled to RC band-pass filters F4–F6 respectively. On the column electrodes, the pull-down resistors 38 are coupled to corresponding RC band-pass networks F1–F3 respectively. Each of the stripes of the memory module array makes a separate connection to a power supply V or –V. Crossing the column electrodes 34 between the cross point array 36 and the terminating resistors 38 are a plurality of column address lines 40 and at least one column sense line 42. The column address lines 40 and column sense line(s) 42 are formed on the same conductive layer as the row electrodes so that where they cross the column electrodes diodes junctions are formed there between. Blowing selected ones of the columns address line elements, leaving entact the desired diode connections, forms the address line group/node arrangement described above. One of ordinary skill in the art will appreciate that this programming of the addressing circuitry can be finalized after the fabrication of the circuitry.

Row address lines 44, and as a minimum, one row sense line 46 NOT SHOWN IN FIG. 3 similarly cross the row electrodes 34. The row address lines 44 and the row sense line(s) 46 are formed on the same conductive layer as the column electrodes, creating row address diodes and row sense diodes (not shown).

Figure 4:
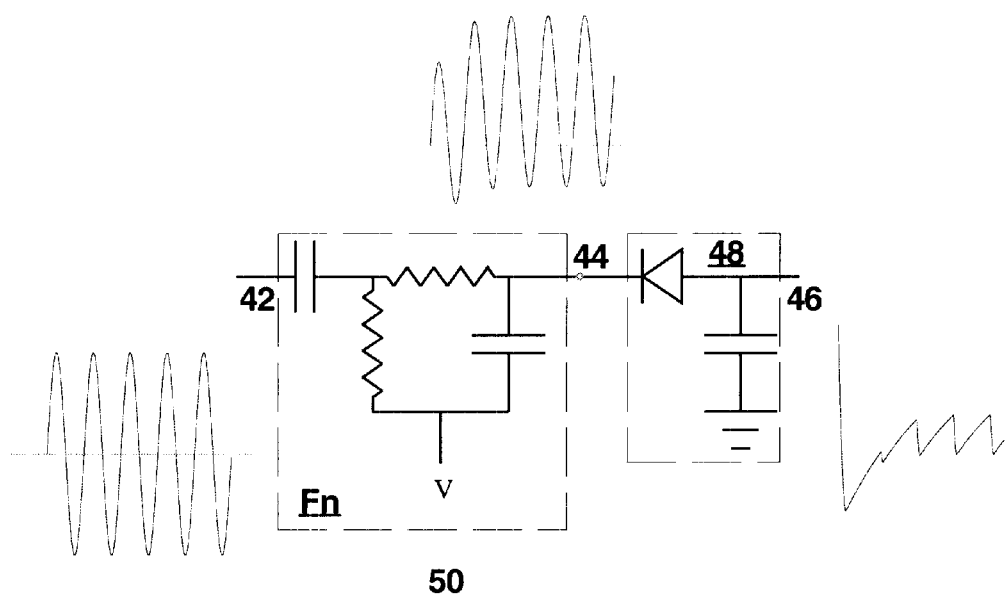
FIG. 4 is an illustration of the RC band-pass filter network coupled to the rectifier circuit.

The Filters F1–F6 are preferably simple band-pass filters. FIG. 4 illustrates a band-pass filter Fn and a rectifier circuit 48 that makes-up the modulation circuit 28. The Figure also illustrates three waveforms that depict the input signal at three points; the input 42, output 44 of the band-pass filter, and the output of the rectifier respectively 48. The band-pass filter circuit 50 is composed of RC components coupled to a power supply V. The rectifier circuit 58 is connected in series to the band-pass filter circuit 50. The rectifier circuit 58 comprises a diode in series with a capacitor. One of ordinary skill in the art recognizes that this is only one of many possible implementations of this network.

When an AC signal of the appropriate frequency is present at the input 42 a negative DC voltage is produced at the output 46. In other cases, the DC signal at the output is driven to +V helping to reverse bias the diode in the rectifier circuit. One of ordinary skill in the art would recognize that the passive components could be rectifiers or high Q (quality) electro-mechanical filters, as well as, RC networks.

Referring back to FIG. 3, the memory module array 30 can be configured to reduce the connections required between the interface circuit 16 and the controller 14. The power supply is coupled to the band-pass filters F1–F6, and rectifier 48. Applying a voltage to one of the three row groups and an opposing voltage to one of the three column groups (for example, F1 and F6 and leaving the others open, we can activate any of one of nine sub-arrays in the cross-point array 36. If each of the RC band-pass filters F1-F6 50 is tuned to a different frequency then each can be selectively excited (assuming adequate separation of the frequencies). The result is that address, sense and power signals can be spread over the frequency spectrum, thus a single line can be used to carry multiple signals. The signals are then applied to the line reduction circuit 24, which transmits the signals via the interface connector 16, to the interface and control circuit 14.

The above stated method illustrates how the numbers of interconnections required for the sense, address and power lines can be reduced. Hereinafter, is a method of how the sense lines 42 in the memory module 20 in particular, can be reduced.

The band-pass filter/rectifier circuits (50/48) are coupled to the cathodes of the memory diodes and the only band-pass filters circuits 48 are coupled to the anodes. (The cathodes and the anodes of the memory diodes are not shown) When a memory diode in an active sub-array is addressed, it will have an AC signal applied to it.

The diodes are biased such that an intact data diode will remain in conduction continuously and that the base cathode of the data diode is held below ground. A sense diode (a diode on either the column/row sense line) is connected to the anode of the data diode and that the cathode of that diode is effectively tied to ground.

In the case when the data diode is intact, no current will flow through the sense diode. In the case when the data diode is blown, a half-wave rectified current signal will flow through the sense diode. If the sense lines from different physical layers 22 are connected (or from any addressed diodes whose row and column lines contain no intersections, i.e. the row line of data diode A does not intersect the column line of data diode B, nor does the column line of data diode A intersect the row line of data diode B. This condition will upset the biasing of the array), then the currents from the various blown diodes will sum on a common sense line. The currents on the common sense line can be used to reduce the number of sense line connections required.

Figure 5:
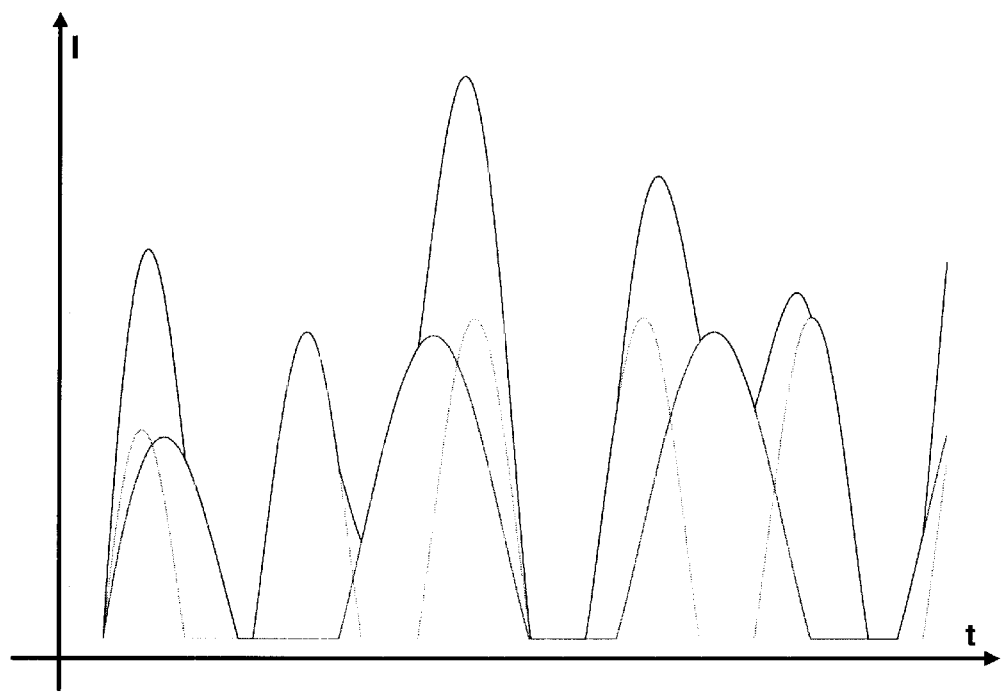
FIG. 5 is an illustration of waveforms output from the addressing circuit.

FIG. 5 shows an illustration of multiple currents 50 for two blown addressed diodes connected to a common upper sense line. The individual current waveforms with their sums 50 are shown. Assuming all the addressed diodes on the common sense line are driven at different frequencies. The state of all the addressed diodes on the sense line can be determined. A sense line connected to the cathodes of the same set of addressed data diodes, referred to as the lower sense line, arranged so that the cathodes of its sense diodes are connected to the cathodes of the data diodes and so that the anodes of its sense diodes are all connected to the lower sense line. The lower sense line is in turn biased at ground can be used to provide checksum information. It will carry one diode current for each blown diode. Each intact diode will also produce a "half-wave-rectified" current at the frequency of the modulation applied to the data diode. This information can be used in conjunction with the AC information supplied by the upper sense line to verify the state of the diodes. Note that the information from the lower sense line alone is insufficient to uniquely determine the state of the diodes.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A memory device comprising:
   a plurality of memory layers, wherein each of the plurality of layers includes a memory array;
   a plurality of signal modulating circuits coupled to each of the memory arrays;
   a line reduction circuit coupled to the each of the plurality of memory layers.

2. The memory device of claim 1, wherein:
   each of the plurality of signal modulating circuits comprises a band-pass filter circuit coupled to a rectifier circuit in series.

3. The memory device of claim 1, further comprising:
   an interface and control circuit coupled to the line reduction circuit via an interface connection.

4. The memory circuit of claim 3, wherein
   the memory array is a cross-point memory array.

5. The memory circuit of claim 1, wherein the line reduction circuit is a multiplexing/demultiplexing circuit.

6. The memory circuit of claim 1, wherein the line reduction circuit is implemented on a thin non-semiconductor substrate.

7. A memory device comprising:
   a coss-point memory array having first and second sets of transverse electrodes and an addressing circuit;
   a filter and rectifier circuit connected in series; and
   a line reduction circuit;

wherein the filter and rectifier circuit spreads predetermined signals across a frequency spectrum.

8. The memory device of claim 7, wherein the line reduction circuit comprises a multiplexer and demultiplexer circuits.

9. The memory device of claim 7, wherein at least one of filters and the high resistive circuits are coupled to a power supply.

10. The memory device of claim 7, wherein the filter is band-pass filters and the rectifier circuit includes a diode.

11. The memory device of claim 7, wherein the first and second sets of transverse electrodes are formed with respective memory elements formed at the crossing points of the first and second set of electrodes.

12. The memory device of claim 7, wherein the first connections couple each memory array electrode in the first set to a respective unique subset of the first set of address lines and the second connections couple each memory array electrode in the second set to a respective unique subset of the second set of memory array electrodes.

13. The memory device of claim 7, further comprising an interface circuit which is coupled to each of the plurality of memory layer circuits.

14. A method for reducing the number of interconnections between a memory module and a memory controller comprising the steps of:

addressing a memory element in the memory array by applying a predetermined electrical signal to the first and second set of predetermined lines to enable the state of the memory element; and transmitting the addresses from the memory array to an interface and control circuit by spreading multiple memory element addresses over a predetermined frequency spectrum.

15. The method of claim 14, wherein the step of spreading multiple memory element addresses is carried out using a filter and rectifier circuit connected in series.

16. The method of claim 15, wherein the filter is a band-pass filter.

17. The method of claim 14, further comprising:

multiplexing the spread addresses and transmitting the address to said interface and control circuit via an interface.

* * * * *